United States Patent
Mohn et al.

(10) Patent No.: US 6,401,652 B1
(45) Date of Patent: Jun. 11, 2002

(54) PLASMA REACTOR INDUCTIVE COIL ANTENNA WITH FLAT SURFACE FACING THE PLASMA

(75) Inventors: Jonathan D. Mohn, Saratoga; Arthur H. Sato, San Jose; Kien Nai Chuc, Cupertino, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/565,568

(22) Filed: May 4, 2000

(51) Int. Cl.$^7$ .......................... C23C 16/00; H05H 1/00; H01L 21/00

(52) U.S. Cl. ............................ 118/723 AN; 118/723 I; 118/723 IR; 156/345.48; 438/710

(58) Field of Search ........................ 118/723 AN, 723 I, 118/723 IR, 723 E; 156/345.48, 345.47; 438/710

(56) References Cited

U.S. PATENT DOCUMENTS

| | | |
|---|---|---|
| 4,123,316 A | 10/1978 | Tsuchimoto |
| 4,261,762 A | 4/1981 | King |
| 4,350,578 A | 9/1982 | Frieser et al. |
| 4,368,092 A | 1/1983 | Steinberg et al. |
| 4,371,412 A | 2/1983 | Nishizawa |
| 4,427,516 A | 1/1984 | Levinstein et al. |
| 4,427,762 A | 1/1984 | Takahashi et al. |
| 4,430,547 A | 2/1984 | Yoneda et al. |
| 4,457,359 A | 7/1984 | Holden |
| 4,512,391 A | 4/1985 | Harra |
| 4,565,601 A | 1/1986 | Kakehi et al. |
| 4,572,759 A | 2/1986 | Benzing |
| 4,579,080 A | 4/1986 | Martin et al. |
| 4,711,698 A | 12/1987 | Douglas |

(List continued on next page.)

FOREIGN PATENT DOCUMENTS

| | | |
|---|---|---|
| DE | 39 42964 A1 | 6/1991 |
| EP | 0 403 418 A2 | 12/1990 |
| EP | 0 413 282 A2 | 2/1991 |
| EP | 0 520 519 A1 | 12/1992 |
| EP | 0 552 490 A1 | 7/1993 |
| EP | 0 552 491 A1 | 7/1993 |
| EP | 0 596 551 A1 | 5/1994 |

(List continued on next page.)

OTHER PUBLICATIONS

Coburn, W.J., "Increasing the Etch Rate Ratio oSiO2/Si in Fluorocarbon Plasma Etching," *IBM Technical Disclosure*, vol. 19, No. 10, Mar. 1997.

Cook, J.M., Ibbatson, D.E., and Flamm, D.L., "Application of a low–pressure radio frequency discharge source to polysilicon gate etching," *J. Vac. Sci. Technol.*, vol. B8, No. 1, Jan./Feb. 1990, pp. 1–5.

Horiike, Y., Kubota, K., Shindo, H., and Fukasawa, T., "High rate and highly selective SiO$_2$ etching employing inductively coupled plasma and discussion on reaction kinetics," *J. Vac. Sci. Technol.*, vol. 13, No. 3, May/Jun. 1995, pp. 801–809.

(List continued on next page.)

*Primary Examiner*—Gregory Mills
*Assistant Examiner*—P. Hassanzadeh
(74) *Attorney, Agent, or Firm*—Michaelson and Wallace; Joseph Bach

(57) ABSTRACT

The present invention is embodied in a plasma reactor with an inductive coil antenna facing the reactor chamber in which the windings of the coil antenna have a flattened cross-sectional shape, the flat portion of the winding facing toward the plasma within the reactor. Preferably, the coil antenna is located outside the reactor and faces a ceiling or wall of the reactor chamber. The coil antenna may be a single helical coil winding or multiple concentric spiral windings.

42 Claims, 9 Drawing Sheets

U.S. PATENT DOCUMENTS

| | | |
|---|---|---|
| 4,755,345 A | 7/1988 | Baity, Jr. et al. |
| 4,756,810 A | 7/1988 | Lamont, Jr. et al. |
| 4,786,352 A | 11/1988 | Benzing |
| 4,786,359 A | 11/1988 | Stark et al. |
| 4,793,897 A | 12/1988 | Dunfield et al. |
| 4,793,945 A | 12/1988 | Siren |
| 4,795,529 A | 1/1989 | Kawasaki et al. |
| 4,807,016 A | 2/1989 | Douglas |
| 4,810,935 A | 3/1989 | Boswell |
| 4,828,369 A | 5/1989 | Hotomi |
| 4,842,683 A | 6/1989 | Cheng et al. |
| 4,844,775 A | 7/1989 | Keeble |
| 4,849,675 A | 7/1989 | Muller |
| 4,859,908 A | 8/1989 | Yoshida et al. |
| 4,870,245 A | 9/1989 | Price et al. |
| 4,918,031 A | 4/1990 | Flamm et al. |
| 4,948,458 A | 8/1990 | Ogle |
| 4,948,750 A | 8/1990 | Kausche et al. |
| 4,990,229 A | 2/1991 | Campbell et al. |
| 5,000,113 A | 3/1991 | Wang et al. |
| 5,006,220 A | 4/1991 | Hijikata et al. |
| 5,015,330 A | 5/1991 | Okumura et al. |
| 5,074,456 A | 12/1991 | Degner et al. |
| 5,085,727 A | 2/1992 | Steger |
| 5,122,251 A | 6/1992 | Campbell et al. |
| 5,169,487 A | 12/1992 | Langley et al. |
| 5,173,412 A | 12/1992 | Kiener et al. |
| 5,187,454 A | 2/1993 | Collins et al. |
| 5,203,956 A | 4/1993 | Hansen |
| 5,210,466 A | 5/1993 | Collins et al. |
| 5,226,154 A | 7/1993 | Kondoh |
| 5,241,245 A | 8/1993 | Barnes et al. |
| 5,249,251 A | 9/1993 | Egalon et al. |
| 5,258,824 A | 11/1993 | Carlson et al. |
| 5,276,693 A | 1/1994 | Long et al. |
| 5,277,751 A | 1/1994 | Ogle |
| 5,326,404 A | 7/1994 | Sato |
| 5,346,578 A | 9/1994 | Benzing et al. |
| 5,349,313 A | 9/1994 | Collins et al. |
| 5,392,018 A | 2/1995 | Collins et al. |
| 5,399,237 A | 3/1995 | Keswick et al. |
| 5,401,350 A * | 3/1995 | Patrick et al. ............... 156/345 |
| 5,414,246 A | 5/1995 | Shapona |
| 5,421,891 A | 6/1995 | Campbell et al. |
| 5,423,945 A | 6/1995 | Marks et al. |
| 5,449,432 A | 9/1995 | Hanawa |
| 5,468,341 A | 11/1995 | Samukawa |
| 5,477,975 A | 12/1995 | Rice et al. |
| 5,529,657 A | 6/1996 | Ishii |
| 5,556,501 A | 9/1996 | Collins et al. |
| 5,607,542 A | 3/1997 | Wu et al. |
| 5,688,357 A * | 11/1997 | Hanawa ...................... 156/345 |
| 5,935,373 A | 8/1999 | Koshimizu |
| 5,998,931 A * | 12/1999 | Donohoe ............... 315/111.21 |
| 6,087,778 A * | 7/2000 | Benjamin et al. ....... 315/111.51 |
| 6,155,203 A * | 12/2000 | Kennedy et al. .......... 118/723 I |
| 6,164,241 A * | 12/2000 | Chen et al. ................ 118/723 I |
| 6,177,646 B1 * | 1/2001 | Okumura et al. ...... 219/121.43 |

FOREIGN PATENT DOCUMENTS

| | | |
|---|---|---|
| EP | 0 601 468 A1 | 6/1994 |
| EP | 0 641 013 A2 | 3/1995 |
| EP | 0 702 391 A2 | 3/1995 |
| EP | 0 651 434 A2 | 5/1995 |
| EP | 0 680 072 A2 | 11/1995 |
| EP | 0 710 055 A1 | 5/1996 |
| EP | 0 727 807 A1 | 8/1996 |
| EP | 0 727 923 A1 | 8/1996 |
| EP | 0 742 577 A2 | 11/1996 |
| EP | 0 756 309 A1 | 1/1997 |
| EP | 0 807 952 A2 | 11/1997 |
| EP | 0 892 422 A2 | 1/1999 |
| GB | 231197 | 11/1990 |
| JP | 55-9464 | 1/1980 |
| JP | 55-154582 | 12/1980 |
| JP | 57-155732 | 9/1982 |
| JP | 61-147531 | 12/1984 |
| JP | 61-91377 | 5/1986 |
| JP | 61-142744 | 6/1986 |
| JP | 62-12129 | 1/1987 |
| JP | 62-249422 | 10/1987 |
| JP | 62-254428 | 11/1987 |
| JP | 63-9120 | 1/1988 |
| JP | 63-155728 | 6/1988 |
| JP | 64-15928 | 1/1989 |
| JP | 4-94121 | 3/1992 |
| JP | 62-7268 | 1/1997 |
| WO | WO 91/10341 | 7/1991 |
| WO | WO 92/20833 | 11/1992 |
| WO | WO 97/08734 | 3/1997 |

OTHER PUBLICATIONS

Lee, H., Dong–II, Y., and Whang, J., "The effects of magnetic fields on a planar inductively coupled argon plasma," *Plasma Sources Sci. Technol.*, 5(1996), pp. 383–388.

Lieberman, M.A., and Ashida, S., "Global models of pulse–power–modulated high–density, low pressure discharges," *Plasma Sources Sci. Technol.*, 5(1996), pp. 145–158.

Matsuo, Seitaro, "Selective Etching of si02 Relative to Si by Plasma Reactive Sputter Etching," *J. Vac. Sc. Technology*, vol. 17, No. 2, Mar.–Apr. 1980.

Oerhlein, G., and Lee, Y., "Reactive ion etching related Si surface residues and subsurface damage: Their relationship to fundamental etching mechanisms," *J. Vac. Sci. Technol.*, vol. 5, No. 4, Jul./Aug. 1987, pp. 1585–1594.

Perry, A.J., Vender, D., and Boswell, R.W., "The application of the helicon source to plasma processing," *J. Vac. Sci. Technol.*, vol. 9, No. 2, Mar./Apr. 1991, pp. 310–317.

Samukawa, S., and Ohtake, H., "Pulse–time Modulated Plasma Etching for Precise ULSI Patterning," Abstract No. 162, *Microelectrics Research Laboratories*, NEC Corporation, Japan, May 1996, pp. 217–218.

Shibano, T., Fujiwara, N. Hirayama, M., Nagata, H., and Demizu, K., "etching of $SiO_2$ by low energy CF+x and $F^+$ions," *Appl. Phys. Lett.*, vol. 63, No. 17, Oct. 25, 1993, pp. 2336–2338.

Suagi, H., and Nakamura, K., "Diagnostics and control of radicals in an inductively coupled etching reactor," *J. Vac. Sci. Technol.*, vol. 13, No. 3, May/Jun. 1995, pp. 8878–8893.

Tynan, GR., Bailey III, A.D., Campbell, G.A., Charatan, R., de Chambrier, A., Gibson, G., Hemker, D.J., Jones, K., Kuthi, A., Lee, C., and Wilcoxson, M., "Characterization of an Azimuthally Symmetric Helicon Wave High Density Plasma Source," *Trikon Technologies*, Inc., Japan, Jul. 1997.

European Patent Office Communication Pursuant to Article 96(2) and Rule 51(2) EPC for Application No. 94307307.2–2208, mailed Jan., 1996.

Patent Abstracts of Japan, Publication No. 11026433, Jan. 29, 1999 (Matsushita Electron Corp).

Patent Abstracts of Japan, Publication No. 57045927 A, Mar. 16, 1982 (Fujitsu Ltd).

Patent Abstracts of Japan, Publication No. 62052714 A, Mar. 7, 1987 (Olympus Optical Co. Ltd; Toagosei Chem Ind Co Ltd).

Patent Abstracts of Japan, Publication No. 06196446 A, Jul. 15, 1994 (NEC Corp).

Patent Abstracts of Japan, Publication No. 07288196 A, Oct. 31, 1995 (Tokyo Electron Ltd).

Patent Abstracts of Japan, Publication No. 08017799 A, Jan. 19, 1996 (Plasma Syst: KK).

* cited by examiner

PLASMA REACTOR INDUCTIVE COIL ANTENNA WITH FLAT SURFACE FACING THE PLASMA

BACKGROUND OF THE INVENTION

1. Technical Field

The invention is related to high density inductively coupled plasma reactors of the type used in semiconductor wafer processing, and in particular to the inductive coil antenna which inductively couples RF plasma source power to the plasma.

2. Background Art

It is difficult to maintain a uniform ion density distribution in a plasma reactor of the type employed in etch and deposition processes in semiconductor integrated circuit fabrication. As semiconductor integrated circuit device geometries become increasingly dense and small, the effect of non-uniformities in plasma ion density in the plasma reactor becomes more significant. Much work has been directed to improving the uniformity of the radial distribution of plasma ion density near the surface of the semiconductor wafer or workpiece. For example, in an inductively coupled plasma reactor having an overhead coil antenna, it has been found that certain multi-radius dome shapes for the coil antenna and for the ceiling provide the greatest uniformity in radial distribution of plasma ion density. This is described in U.S. patent application Ser. No. 08/778,051, filed Jan. 2, 1997, by Gerald Yin et al., entitled RF PLASMA REACTOR WITH HYBRID CONDUCTOR AND MULTI-RADIUS DOME CEILING and assigned to the assignee of the present application. Such coil geometries govern the vertical displacement of the coil from the plasma or workpiece and are critical in achieving a more uniform plasma ion density distribution over the wafer or workpiece surface. As circuit device geometries become smaller, variations in the vertical height from the optimal coil geometry have greater effect on plasma processing results. In other words, the process is very sensitive to deviations in height of the coil antenna from the ideal geometry. One consequence of this is that processing performance is inconsistent and not reproducible between reactors of the identical design. It is felt that a principal cause is the variations in coil antenna geometry between different plasma reactors.

A related problem is that in those reactors having a multi-radius dome ceiling of the ideal shape for enhancing plasma uniformity, the coil antenna must conform closely to the ceiling, and must be located close to the ceiling along the entire length of the coil. One result of this is that the coil induces sputtering of the ceiling near the high voltage end of the coil due to the coil's close proximity to the ceiling. Such sputtering produces contaminants that degrade the performance of the plasma reactor. Because of the concerns described above about maintaining a uniform plasma ion density across the wafer or workpiece surface, the proximity of the coil to the ceiling cannot be modified to solve this problem.

Another problem with inductively coupled reactors is that the reactance of the coil antenna is primarily inductive, while plasma ignition is best facilitated by capacitive coupling. As a result, plasma ignition using a coil antenna with certain gases such as SF6 that are relatively difficult to ignite requires a large amount of power, sometimes exceeding the power level of the desired process recipe.

SUMMARY OF THE INVENTION

The invention is embodied in a plasma reactor including a chamber enclosure capable of containing process gases, a workpiece support for supporting a semiconductor workpiece within the chamber enclosure, a coil antenna adjacent an exterior surface of the chamber enclosure, the coil antenna having plural windings of a conductor, the windings having a flattened cross-sectional shape defining a major flattened surface thereof generally facing an interior of the chamber enclosure, and an RF power supply connected to the coil antenna.

DETAILED DESCRIPTION OF THE PREFERRED EMBODIMENTS

Figure 1A:
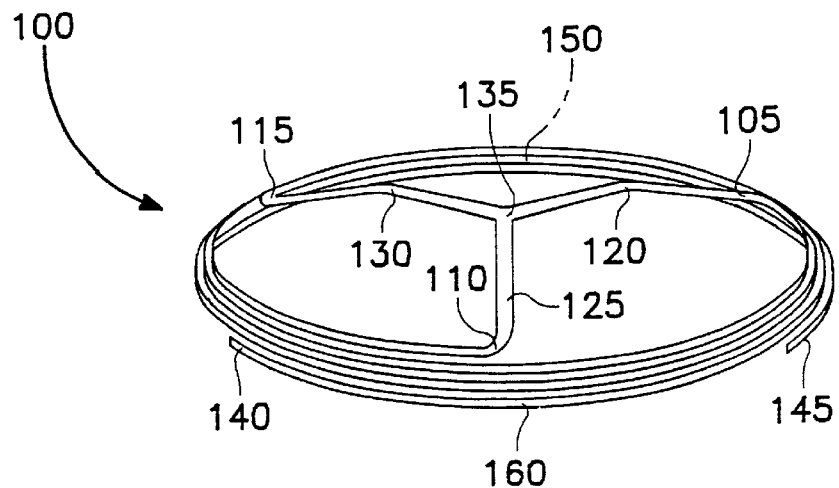
FIGS. 1A–1C illustrate different views of a multiple concentric spiral coil antenna embodying a principal aspect of the present invention.

The present invention is embodied in a plasma reactor with an inductive coil antenna facing the reactor chamber in which the windings of the coil antenna have a flattened cross-sectional shape, the flat portion of the winding facing toward the plasma within the reactor. Preferably, the coil antenna is located outside the reactor and faces a ceiling or wall of the reactor chamber. The coil antenna may be a single helical coil winding or multiple concentric spiral windings. The coil antenna may be a single section connected to a single RF power generator or may be separate plural sections at respective radii with independently controlled RF power levels. In a preferred implementation, the coil antenna at least approximates a multi-radius dome shape ideal for optimizing uniformity of radial distribution of plasma ion density. However, other coil antenna shapes or geometries may be implemented in accordance with the invention. Preferably, the width of the flattened surface of each winding is greater than the thickness of the winding by at least a factor of two and as much as an order of magnitude, but not necessarily limited thereto. The flattened winding cross-sectional shape provides a much greater capacitive coupling from the coil antenna to the plasma in the chamber, due primarily to the increased surface area of each winding facing the plasma. This increased surface area permits the distance of the coil antenna from the plasma to be proportionately increased for a given capacitance between the coil and plasma. (This is because capacitance is proportional to area and inversely proportional to distance.) With this increase in distance, the entire system becomes less sensitive to small variations in distance between the inductive coil antenna and the plasma, a significant advantage. This is because such small distance variations represent a correspondingly smaller fraction of the total distance, and therefore cause a correspondingly smaller change in inductive and capacitive coupling. The result is that inductively coupled plasma reactors employing the inductive coil of the present invention realize greater reproducibility of etch performance and consistency of results between reactors of identical design, a significant advantage.

Another advantage of the invention is that plasma ignition can be carried out at much lower power due to the increased capacitive coupling to the plasma. In one example, the power required for ignition was reduced by about one order of magnitude.

The capacitive coupling of the coil antenna to the plasma at selected locations may be reduced as desired without reducing the antenna's capacitive coupling elsewhere by varying the width of the flattened surface area of the coil antenna windings as a function of location. In a preferred embodiment of the invention, sputtering of the ceiling underneath the coil antenna, particularly near the high voltage end of the coil antenna, is reduced in this way. In a preferred embodiment, the width is maximum at the low voltage (grounded) end of the coil antenna and is minimum at the high voltage (RF hot) end of the coil antenna. Other variations in the coil flattened area width as a function of location may be made for other purposes. In any case, for plasma regions in which it is desired to increase the capacitive coupling, the width of the coil antenna windings overlying those regions is increased. For plasma regions in which it is desired to decrease capacitive coupling, the width of the coil antenna windings overlying those regions is decreased.

The RF electrical potential of the coil antenna of the present invention may be reduced without reducing its enhanced capacitive coupling. This is achieved, without having to modify the increased surface area of the flattened region of each winding facing the plasma, by increasing the thickness (height) of the winding cross-section. The increased height increases the capacitive reactance that the coil antenna presents to the RF power generator and impedance match circuit, which therefore reduces the total reactance of the predominantly inductively reactive coil antenna, thereby reducing its total impedance. This reduction in impedance reduces the RF electric potential of the coil antenna. The features of varying flattened coil winding cross-sectional width and increased coil winding cross-sectional height may be combined in the same coil antenna to provide a spatially sculpted enhanced capacitive coupling with reduced RF potential of the coil antenna. One advantage of reduced RF potential of the coil antenna is that this feature tends to reduce sputtering of the ceiling otherwise caused by the coil antenna.

The de-sensitization of the system to variations in coil antenna height achieved by the flattened cross-sectional shape of the coil winding may be exploited in accordance with another preferred embodiment of the invention. Since the coil antenna may now be allowed greater variations in height above the plasma without as discussed above, the high voltage end of the coil antenna may be displaced to a greater height above the chamber ceiling relative to the remainder of the coil antenna without a proportionate diminishment in reactor performance. This feature reduces sputtering of the ceiling which typically occurs at the high voltage end of the coil antenna. This feature may be combined with the features of (a) reduced flattened area width at the coil antenna high voltage end and (b) increased coil winding thickness, to minimize sputtering of the chamber ceiling.

A preferred method of fabricating the coil antenna of the invention begins by shaping a flat copper plate by a roller cold-working the plate against a mandrel of the desired shape (e.g., multi-radius dome). Thereafter, a computer-controlled precision water jet milling process is employed to cut out the voids between adjacent coil windings. This fabrication method can hold tolerances of about 2 mils (thousandths of an inch) or 5 thousandths of a centimeter.

Figure 1B:
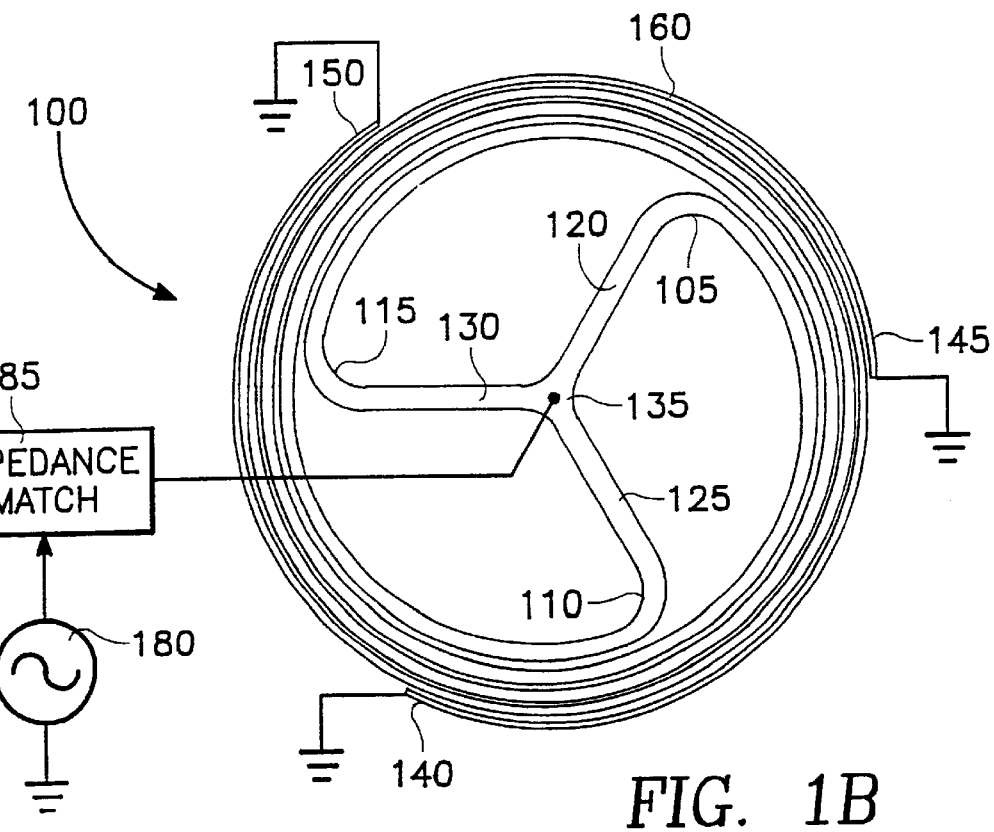
Figures 1C, 1D:
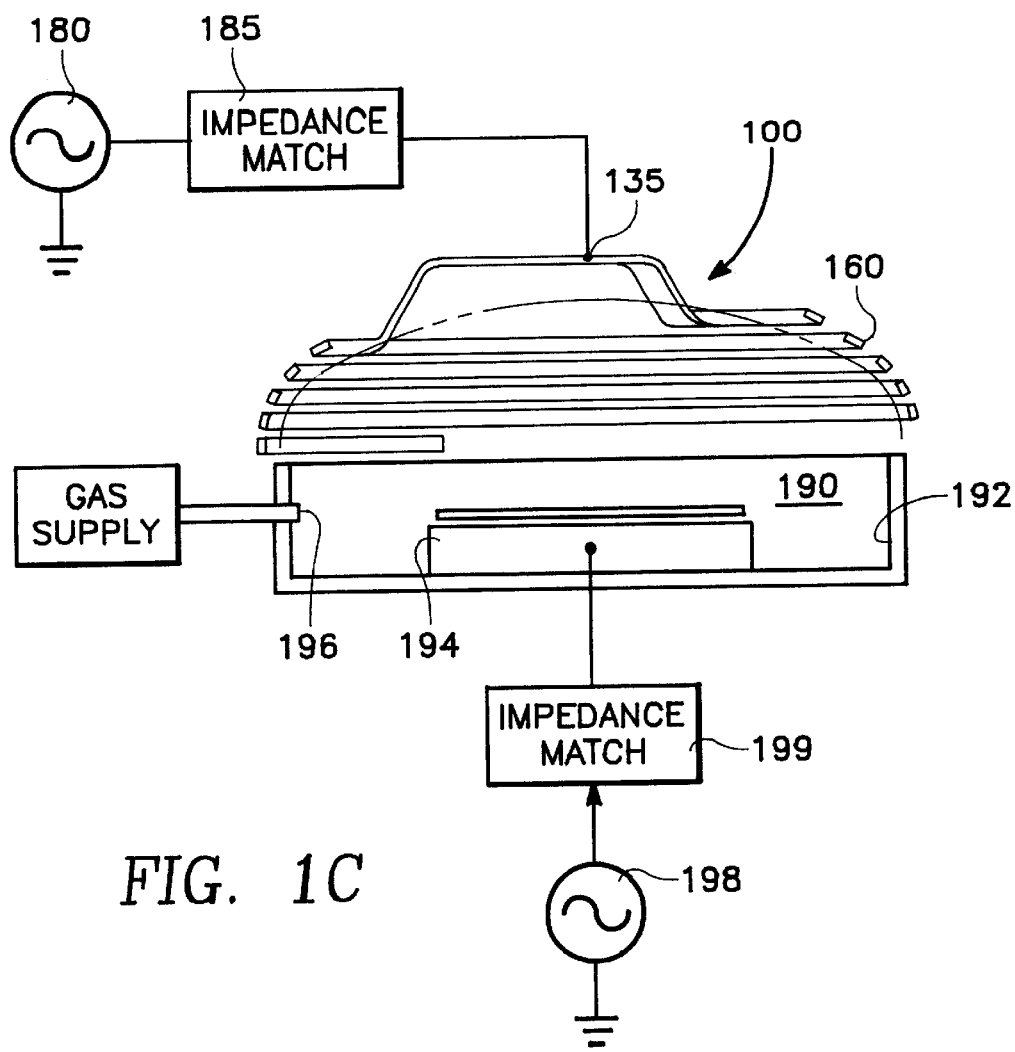
FIG. 1D is a cross-sectional view of a portion of the coil antenna of FIG. 1C.

FIGS. 1A, 1B and 1C illustrate a dome-shaped multiple concentric spiral coil antenna 100 embodying the main feature of the present invention, namely a flattened cross-sectional winding shape with the flattened surface facing the chamber interior. The illustrated antenna 100 has three concentric spiral windings with interior ends 105, 110, 115 connected by radial arms 120, 125, 130 to a common center 135, and three exterior ends 140, 145, 150. The radial arms 120 are raised well-above the remainder of the antenna in order to minimize their interaction with the plasma. Such a multiple concentric spiral coil antenna is described in U.S. Pat. No. 5,919,382 by Qian et al. entitled Inductively Coupled Plasma Reactor with Symmetrical parallel Multiple Coils Having a Common RF Terminal. Typically, the complex 3-dimensional shape of such a coil antenna has favored its fabrication from cylindrical copper tubing having a circular cross-sectional shape due to the flexibility of such tubing. The cross-sectional shape of one of the windings 160 is shown in the enlarged cross-sectional perspective view of FIG. 1D. The winding 160 is flattened to form a generally flat interior surface 170 facing toward the plasma in the reactor interior (not illustrated). The flattened surface 170 has a width w and a thickness t, the width w preferably being several times larger than the thickness t. The greater the width w along any portion of the antenna 100, the greater the capacitive coupling to the plasma of that portion.

As shown in FIGS. 1B and 1C, the antenna center 135 is driven by an RF plasma source power generator 180 through an impedance match circuit 185. The plasma reactor 190 has a cylindrical side wall 192, a dome-shaped ceiling (not visible in the drawings) underlying the coil antenna 100, a wafer pedestal 194 and a gas inlet 196. A bias power generator 198 is connected to the wafer pedestal 194 through an impedance match circuit 199.

Figure 2A:
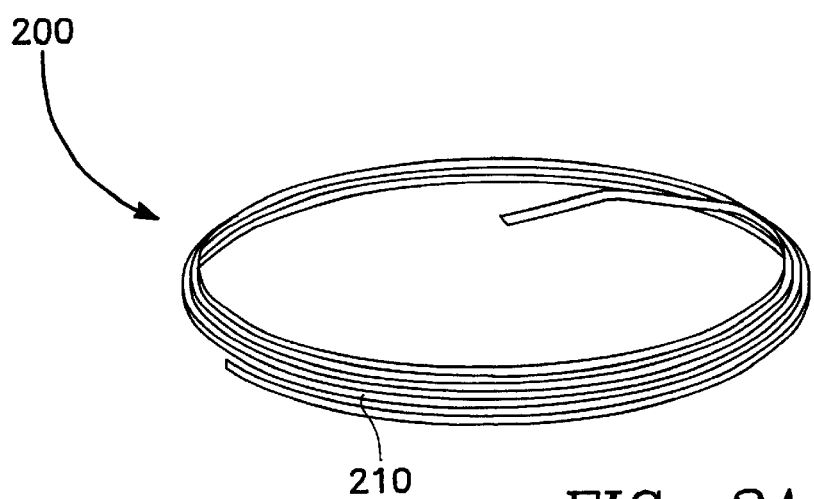
FIGS. 2A–2B illustrate different views of a single helix winding coil antenna embodying a principal aspect of the present invention.
Figure 2B:
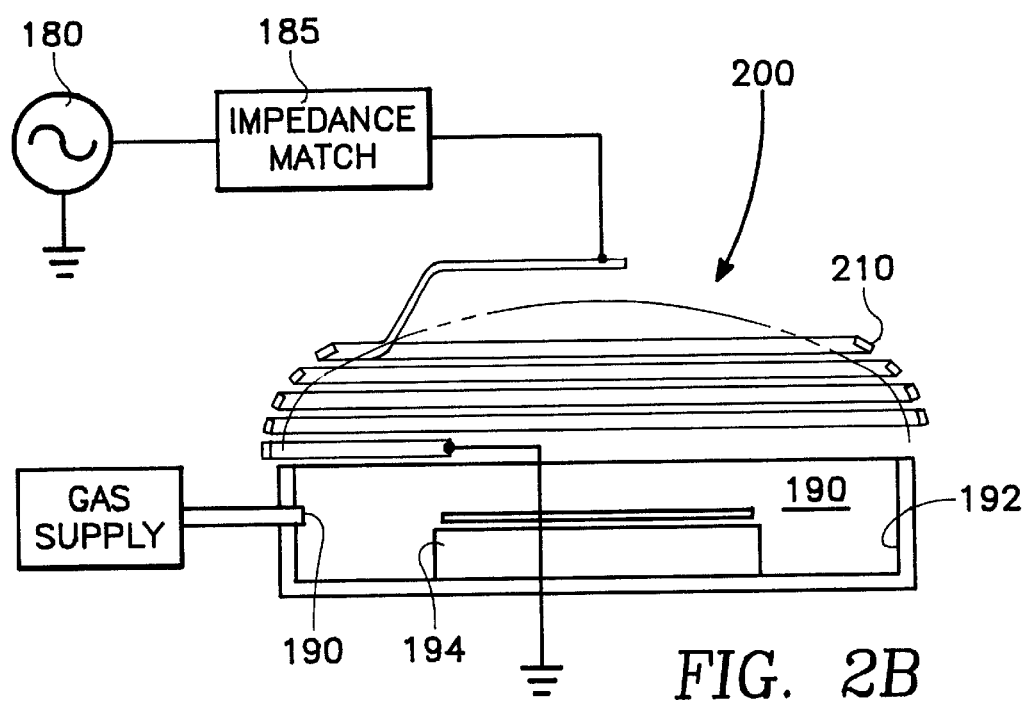
Figure 2C:
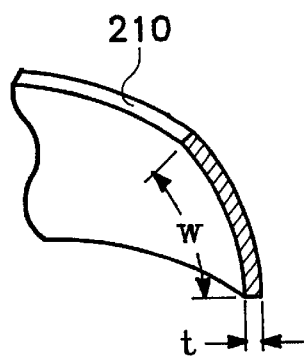
FIG. 2C is a cross-sectional view of a portion of the coil antenna of FIG. 2B.

FIGS. 2A and 2B illustrate a coil antenna 200 corresponding to the coil antenna 100 of FIGS. 1A–1D, but has only a single helical winding 210. Its cross-sectional shape illustrated in FIG. 2C is generally the same as that of FIGS. 1A–1D.

The remaining drawings of this specification illustrate various coil antennas, each one of which may be either a multiple concentric spiral coil antenna of the type illustrated in FIGS. 1A–1C or a single winding coil antenna of the type illustrated in FIGS. 2A–2B.

Figure 3:
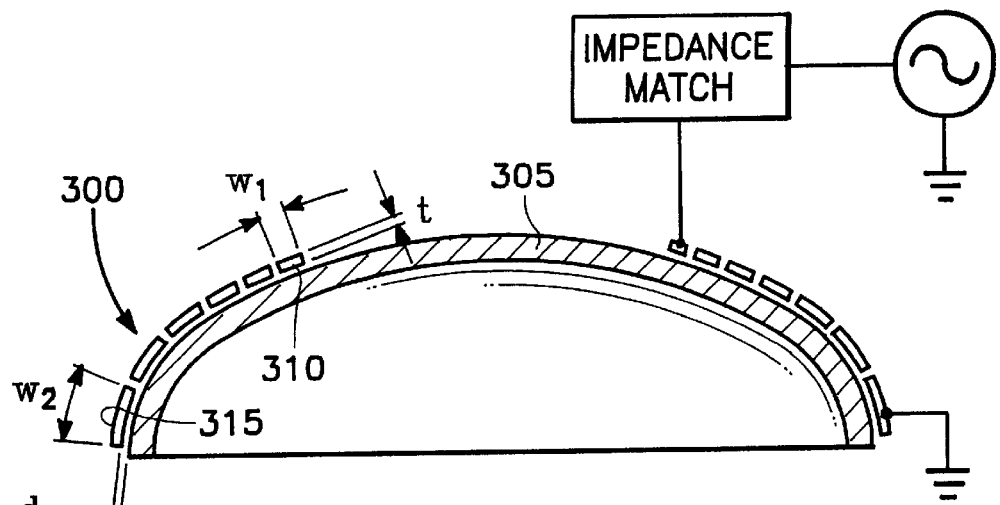
FIG. 3 illustrates a coil antenna of the invention which generally conforms to an underlying multi-radius dome-shaped ceiling.

The coil antenna 300 of FIG. 3 may be either a single winding or multiple concentric spiral windings. In a preferred embodiment, the shape of the coil antenna 300 at least approximates a multi-radius dome shape as shown in the drawing, which is ideal for optimizing uniformity of radial distribution of plasma ion density. However, other coil antenna shapes or geometries may be implemented in accordance with the invention. The flattened winding cross-sectional shape provides a much greater capacitive coupling from the coil antenna to the plasma in the chamber, due primarily to the increased surface area of each winding facing the plasma.

This increased surface area permits the distance of the coil antenna from the plasma to be proportionately increased for a given capacitance between the coil and plasma. (This is because capacitance is proportional to area and inversely proportional to distance.) With this increase in distance, the entire system becomes less sensitive to small variations in distance between the inductive coil antenna and the plasma, a significant advantage. This is because such small distance variations represent a correspondingly smaller fraction of the total distance, and therefore cause a correspondingly smaller change in inductive and capacitive coupling. The result is that inductively coupled plasma reactors employing the inductive coil of the present invention realize greater reproducibility of etch performance and consistency of results between reactors of identical design, a significant advantage.

In one working example, the distance d from a coil antenna having a circular cross-sectional shape to the ceiling was about 0.22 in. Replacing that coil antenna with a similarly-size coil antenna having a flattened cross-sectional shape in accordance with the invention permitted the antenna-to-ceiling distance to be more than doubled to about 0.5 inch with no significant loss or compromise of plasma reactor performance.

The capacitive coupling of the coil antenna 300 to the plasma at selected locations may be reduced as desired without reducing the antenna's capacitive coupling elsewhere by varying the width of the flattened surface area of the coil antenna windings as a function of location. In a preferred embodiment of the invention, sputtering of the ceiling 305 underneath the coil antenna, particularly near the high voltage end 310 of the coil antenna 300, is reduced in this way. In a preferred embodiment, the width w2 at the low voltage (grounded) end 315 of the coil antenna 300 is maximum and the width w1 at the high voltage (RF hot) end 310 is minimum. Other variations as a function of location in the coil flattened area width may be made for other purposes. In any case, for plasma regions in which it is desired to increase the capacitive coupling, the width of the coil antenna windings overlying those regions is increased. For plasma regions in which it is desired to decrease capacitive coupling, the width of the coil antenna windings overlying those regions is decreased.

Figure 12:
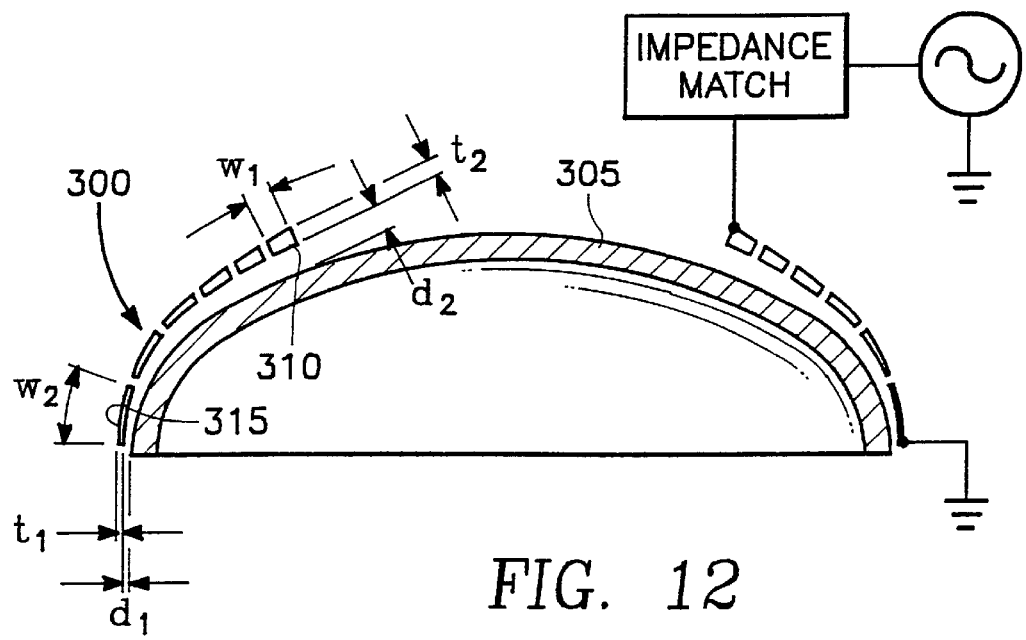
FIG. 12 illustrates a modification of the embodiment of FIG. 3 in which the coil thickness varies with radius.

The RF electrical potential of the coil antenna 300 may be reduced without reducing its enhanced capacitive coupling. This is achieved, without having to modify the increased surface area of the flattened region of each winding facing the plasma, by increasing the thickness t of the winding cross-section. The increased thickness t increases the capacitive reactance that the coil antenna presents to the RF power generator and impedance match circuit, which therefore reduces the total reactance of the predominantly inductively reactive coil antenna, thereby reducing its total impedance. This reduction in impedance reduces the RF electric potential of the coil antenna. The features of varying flattened coil winding cross-sectional width and increased coil winding cross-sectional height may be combined in the same coil antenna 300 as illustrated in FIG. 12 to provide a spatially sculpted enhanced capacitive coupling with reduced RF potential of the coil antenna. One advantage of reduced RF potential of the coil antenna is that this feature tends to reduce sputtering of the ceiling 305 otherwise caused by the coil antenna 300.

Figure 4:
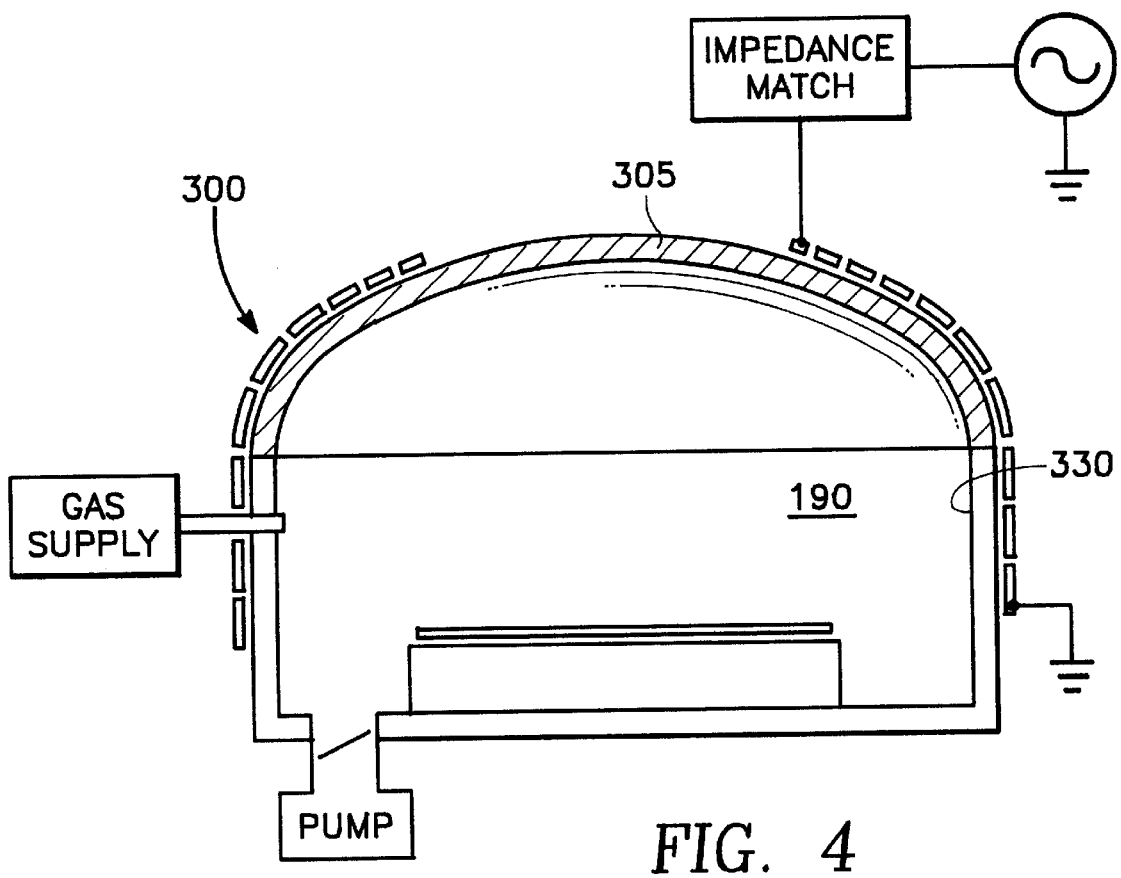
FIG. 4 illustrates a variation of the embodiment of FIG. 3 in which the coil antenna covers both a portion of the ceiling and extends down over the side wall of the reactor.

FIG. 4 illustrates a version of the coil antenna 300 which extends over the ceiling 305 and down the side walls 330 of the reactor.

Figure 5:
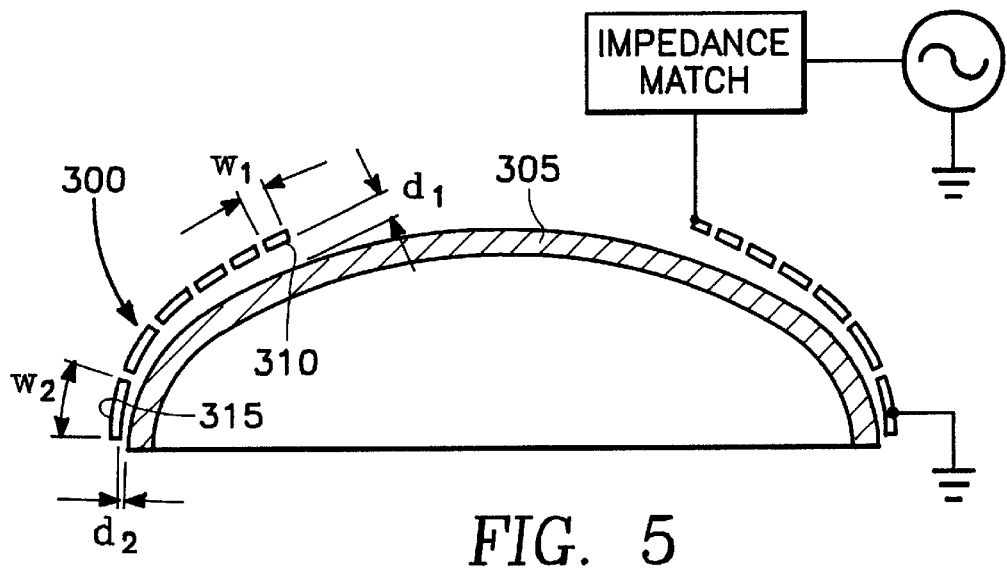
FIG. 5 illustrates a variation of the embodiment of FIG. 3 in which the distance between the coil antenna and the ceiling varies with radial location.

FIG. 5 illustrates a variation of the embodiment of FIG. 3 in which the distance d between the coil antenna 300 and the ceiling 305 increases from the outer coil winding 315 to the inner coil winding 310. The de-sensitization of the system to variations in coil antenna height achieved by the flattened cross-sectional shape of the coil winding is exploited in the embodiment of FIG. 5. Since the coil antenna may now be allowed greater variations in height above the plasma as discussed above, the high voltage end 310 of the coil antenna 300 may be displaced to a greater height above the chamber ceiling 305 relative to the remainder of the coil antenna without a proportionate diminishment in reactor performance. This feature reduces sputtering of the ceiling 305 which typically occurs at the high voltage end 310 of the coil antenna. Thus, the distance d1 of the high voltage winding 310 from the ceiling 305 is greater than the distance d2 of the low voltage winding 315 from the ceiling 305.

Figure 6:
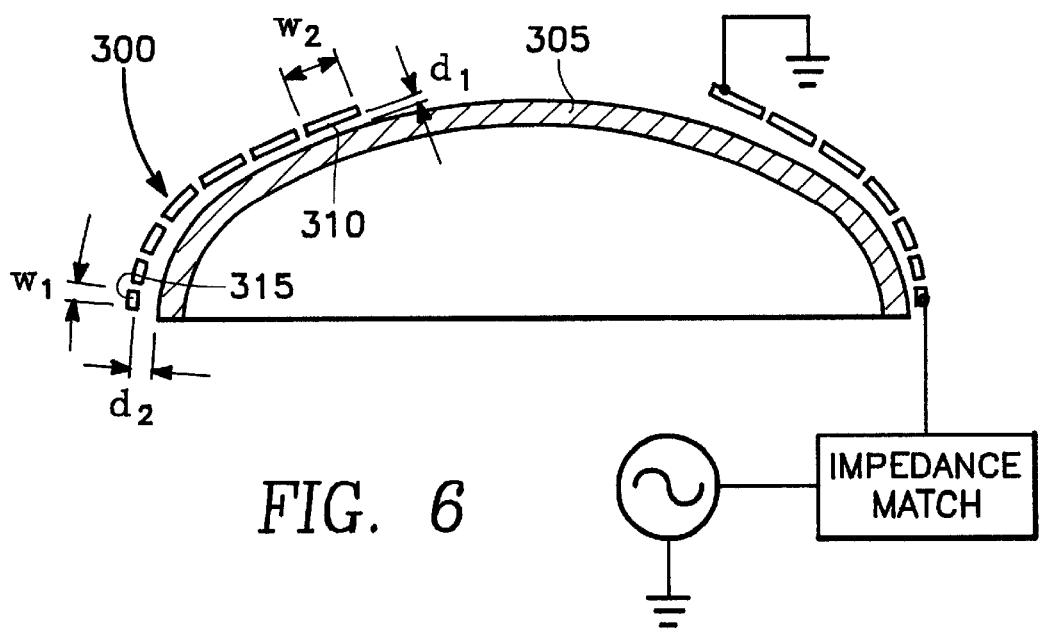
FIG. 6 illustrates a variation of the embodiment of FIG. 5.

FIG. 6 illustrates an embodiment corresponding to that of FIG. 5 except that the connection of the RF generator is reversed so that the coil winding 315 is the high voltage winding and the winding 310 is the low voltage winding. In this case, the progressive growth of the winding flat surface width w is reverse from that of FIG. 5, so that the outermost winding 315 has the smallest width w1 while the innermost winding 310 has the greatest width w2. Moreover, the progression of the coil-to-ceiling displacement d is reversed as well, so that the outermost winding 315 has the greatest displacement d2 while the innermost winding 310 has the smallest displacement d1.

Figure 7A:
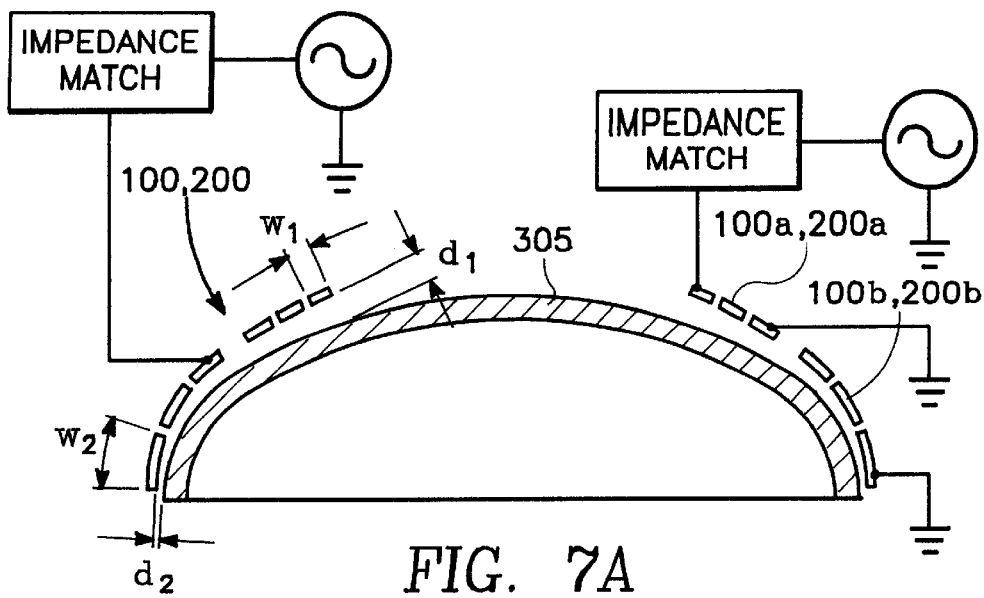
FIG. 7A illustrates a variation of the embodiment of FIG. 3 in which the coil antenna is divided into separately powered radially inner and outer sections.
Figure 7B:
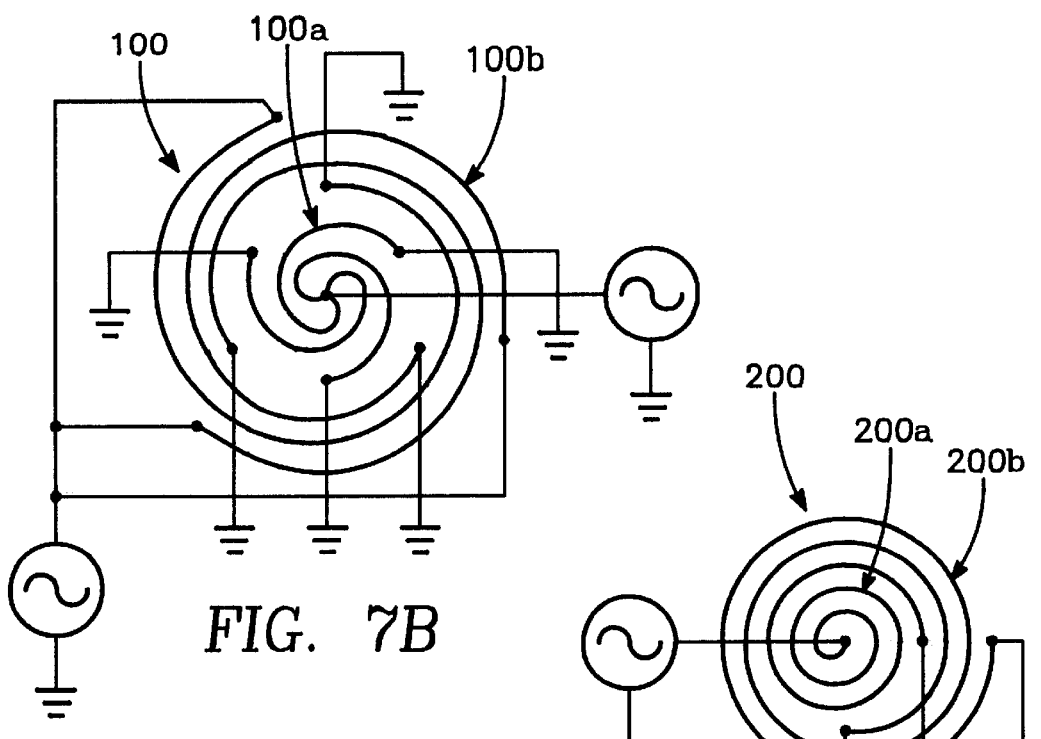
FIG. 7B illustrates electrical connections in a multiple concentric spiral version of the embodiment of FIG. 7A.

FIG. 7A illustrates a variation of the embodiment of FIG. 1A in which the multiple concentric spiral winding coil antenna 100 is divided into electrically separate portions, an inner or center portion 100a and an outer or circumferential portion 100b. FIG. 7B is an electrical schematic diagram illustrating how the three concentric spiral windings of the coil antenna 100 can be divided into the inner and outer portions 100a, 100b and connected to the requisite ground points and RF generators, in accordance with an exemplary implementation.

Figure 7C:
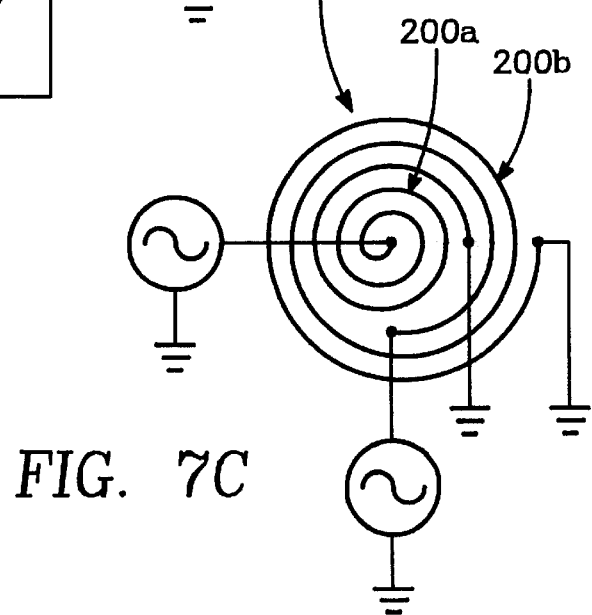
FIG. 7C illustrates electrical connections in a single winding version of the embodiment of FIG. 7A.

FIG. 7A is also illustrative of how the embodiment of FIG. 2A can be modified by dividing the coil antenna 200 into separate inner and outer sections 200a, 200b. FIG. 7C is an electrical schematic diagram illustrating how the three concentric spiral windings of the coil antenna 200 can be divided into the inner and outer portions 200a, 200b and connected to the requisite ground points and RF generators, in accordance with an exemplary implementation.

Figure 8:
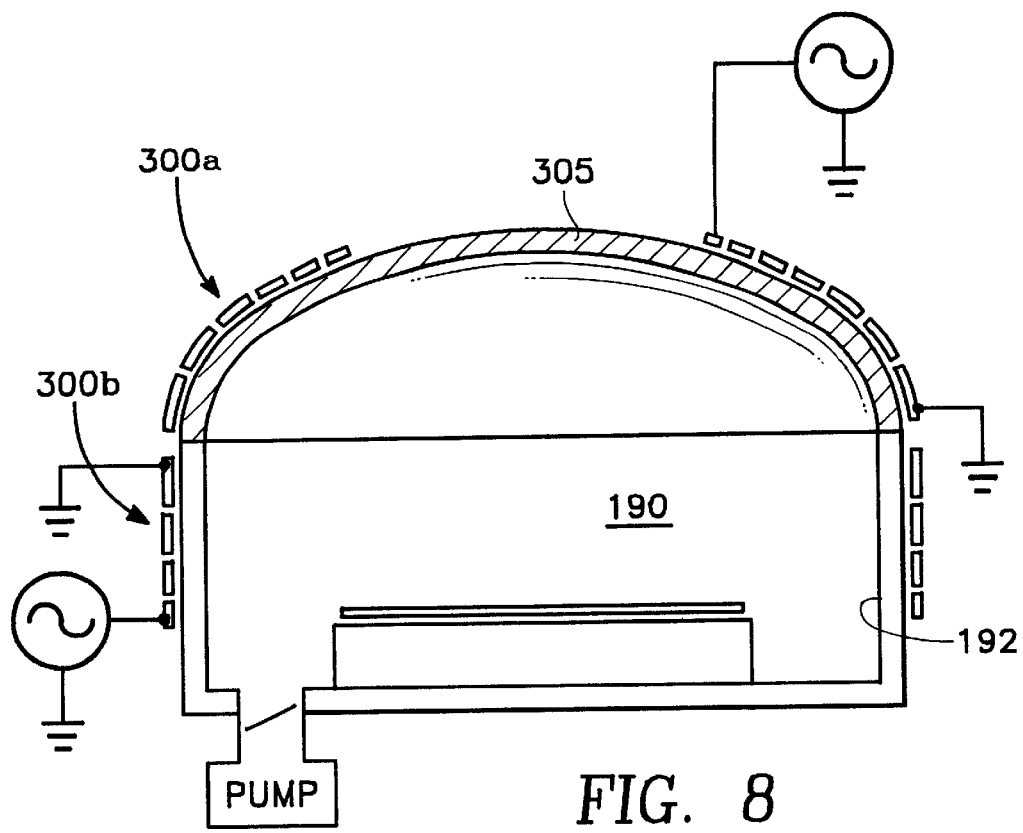
FIG. 8 illustrates how the embodiment of the coil antenna of FIG. 4 may be divided into separately powered sections.
Figure 9:
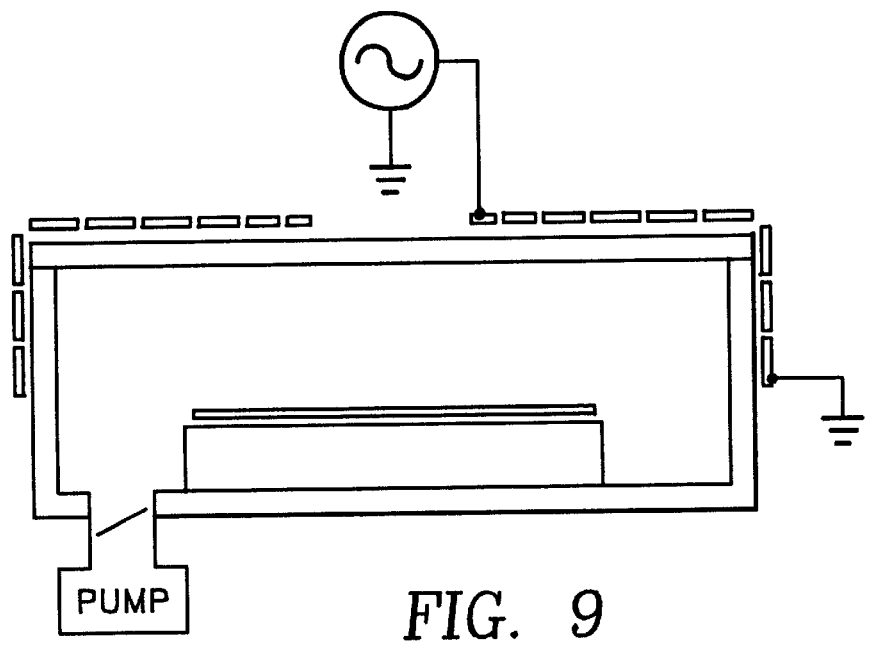
FIG. 9 illustrates a variation of the embodiment of FIG. 4 in which the ceiling is shallow or flat.
Figure 10:
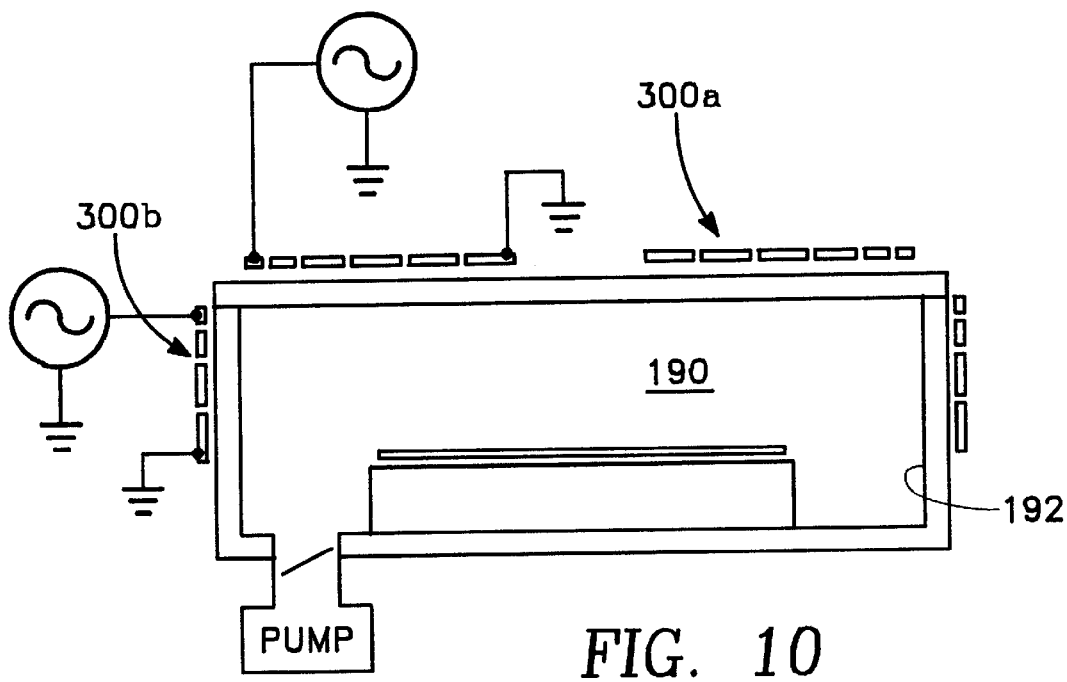
FIG. 10 illustrates a variation of the embodiment of FIG. 8 in which the ceiling is shallow or flat.

FIG. 8 illustrates a modification of the embodiment of FIG. 4 in which the coil antenna 300 is divided into two electrically separate portions as in FIG. 7, an upper portion 300a and a lower portion 300b surrounding the cylindrical side wall. FIG. 9 illustrates a variation from the embodiment of FIG. 4 in which the ceiling is shallow or flat. FIG. 10 illustrates a variation from the embodiment of FIG. 8 in which the ceiling is shallow or flat.

Figure 11:
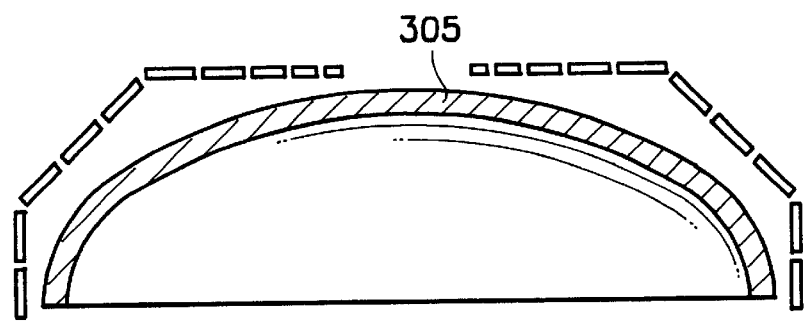
FIG. 11 illustrates a non-conformal coil antenna according to the invention.

FIG. 11 illustrates an embodiment of the flattened coil antenna of the invention having a shape which is non-conformal with that of the ceiling. In FIG. 11, the coil antenna has a trapezoidal shape.

FIG. 12 illustrates a variation of the embodiment of FIG. 5 in which the thickness t of the coil winding(s) decreases from a maximum thickness t2 of the innermost winding to a minimum thickness t1 of the outermost winding.

The enhanced capacitive coupling realized by the flattened coil antenna windings of the invention provides significant advantages. One advantage is that the greater width w of the flattened coil area facing the plasma permits the coil antenna to be located at a further distance from the ceiling and plasma for a given antenna-to-plasma capacitance, thereby reducing the sensitivity of the system to variations across the coil antenna in the antenna-to-ceiling or antenna-to-plasma distance. This provides greater consistency of plasma processing performance and reproducibilty of results among reactors of identical design. Another advantage is that the enhanced capacitive coupling enables plasma ignition at lower RF power levels. However, the greater capacitive coupling between the flattened coil antenna and the plasma achieved by the greater width w of the flattened conductor area facing the plasma can induce undesirable effects. For example, one such undesirable effect is an increase the sputtering of the ceiling proportionately to the increase in capacitive coupling. In accordance with a further aspect of the invention, such undesirable effects are ameliorated or even eliminated—without reducing the antenna-to-plasma capacitive coupling and without necessarily changing the antenna-to-plasma or antenna-to-ceiling distance—by increasing the thickness t of the coil antenna windings. This increased thickness increases the capacitive reactance which the coil antenna presents to the impedance match network of the RF generator. Since the coil antenna reactance is predominantly inductive, the increased capacitive reactance reduces the net reactance of the coil antenna, thus reducing its impedance and thereby reducing its electrical RF potential. The reduction in RF potential of the coil antenna reduces undesirable effects of the enhanced capacitive coupling to the plasma (without having to reduce the capacitive coupling), including such undesirable effects as, for example, sputtering of the ceiling otherwise induced by the coil antenna.

The net result is that the invention can provide the remarkable result of a coil antenna having enhanced capacitive coupling to the plasma but with a reduced RF electrical potential.

As already described, further control over coil antenna performance is achieved by (1) varying the width w of the flattened coil windings as a function of location and/or (2) varying the displacement of the coil antenna from the chamber ceiling as a function of location. For example, in a preferred embodiment, the width w is maximum near the RF grounded end of the coil antenna and minimum near the RF "hot" end of the coil antenna. Also, the coil antenna-to-ceiling distance d is minimum near the RF grounded end of the coil antenna and maximum near the RF "hot" end of the coil antenna. One advantage of this preferred embodiment is that sputtering of the chamber ceiling is minimized or eliminated, particularly when combined with the above-described feature of reducing the coil antenna RF potential by increasing the winding thickness.

Figure 13:
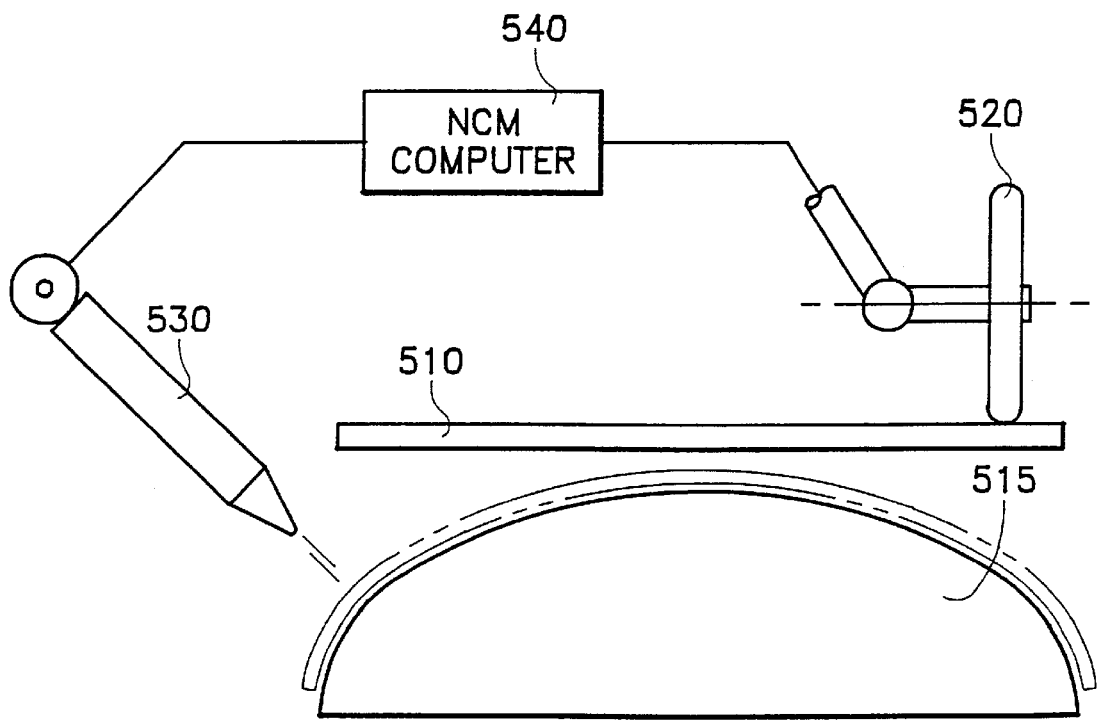
FIG. 13 illustrates a method of fabricating a coil antenna of the invention.

FIG. 13 illustrates a method for fabricating the coil antenna of the invention. First a copper plate 510 of thickness t is held over a mandrel 515 having the desired contour which the coil antenna is to have (e.g., a multi-radius dome shape). A roller bearing 520 cold-works the copper plate 510 over the mandrel 515 until the plate conforms to the (multi-radius dome) shape of the mandrel 515. Then, the windings are defined by milling to form the voids between the adjacent windings. This milling process is carried out by a high-speed water jet 530. The patterns milled by the jet 530 are controlled via a five-axis servo by a numerically controlled machine computer 540. The milling process takes about 30 minutes for a copper sheet thickness of about 0.125 inch.

The flattened cross-section coil antenna of the present invention may be used as the inductive power applicator in a variety of inductively coupled plasma reactor types, including dielectric etch plasma reactors for etching silicon oxide, nitride, etc., metal etch plasma reactors for etching aluminum or copper, chemical vapor deposition plasma reactors for depositing epitaxial silicon or other materials by chemical vapor deposition.

While the invention has been described in detail by specific reference to preferred embodiments, it is understood that variations and modifications thereof may be made without departing from the true spirit and scope of the invention.

What is claimed is:

1. A plasma reactor comprising:
 a chamber enclosure capable of containing process gases;
 a workpiece support for supporting a semiconductor workpiece within said chamber enclosure;
 a coil antenna adjacent an exterior surface of said chamber enclosure, said coil antenna comprising plural windings of a conductor, said windings having a flattened cross-sectional shape defining a major flattened surface thereof generally facing an interior of said chamber enclosure, said flattened surface corresponding to a width of said conductor generally parallel to said flattened surface that is significantly greater than a height thereof perpendicular to said flattened surface, said width exceeding said height along substantially the entire length of said conductor; and
 an RF power supply connected to said coil antenna.

2. The plasma reactor of claim 1 wherein said flattened surface has a width w extending generally transversely with respect to the length of said conductor, and wherein said width varies with location along the length of said conductor.

3. The plasma reactor of claim 2 wherein said width w is maximum near an RF grounded end of the coil antenna and minimum near an RF "hot" end of the coil antenna.

4. The plasma reactor of claim 2 wherein said coil antenna of said flattened cross-sectional shape is located at a distance d from said from said exterior surface, said distance d varying as a function of location along the length of said conductor.

5. The plasma reactor of claim 1 wherein said coil antenna of said flattened cross-sectional shape is located at an average distance d from said from said exterior surface exceeding a nominal distance by an amount sufficient to realize about the same capacitance to a plasma within said enclosure as that of a coil antenna at the nominal distance having a circular cross-sectional shape.

6. The plasma reactor of claim 1 wherein said windings have a thickness t, said thickness being enhanced to reduce an electric RF potential of said coil antenna.

7. The plasma reactor of claim 1 wherein said coil antenna of said flattened cross-sectional shape is located at a distance d from said from said exterior surface, said distance d varying as a function of location along the length of said conductor.

8. The plasma reactor of claim 7 wherein said distance d is minimum near an RF grounded end of the coil antenna and maximum near an opposite end of the coil antenna.

9. The plasma reactor of claim 8 wherein:
said coil antenna of said flattened cross-sectional shape is located at a distance d from said from said exterior surface; and
said distance d is minimum near an RF grounded end of the coil antenna and maximum near an opposite end of the coil antenna.

10. The plasma reactor of claim 1 wherein said coil antenna constitutes a single conductor.

11. The plasma reactor of claim 1 wherein said coil antenna comprises multiple conductors.

12. The plasma reactor of claim 11 wherein said multiple conductors of said coil antenna comprise multiple concentric spiral windings.

13. The plasma reactor of claim 1 wherein said coil antenna defines a dome shape.

14. The plasma reactor of claim 13 wherein said dome shape is a multi-radius dome shape.

15. The plasma reactor of claim 1 wherein said coil antenna and said exterior surface are conformal in shape.

16. The plasma reactor of claim 15 wherein said coil antenna and said exterior surface conform with a 3-dimensional surface.

17. The plasma reactor of claim 1 wherein said coil antenna and said exterior surface are non-conformal in shape.

18. The plasma reactor of claim 17 wherein said coil antenna conforms with a 3-dimensional surface.

19. The plasma reactor of claim 1 wherein:
said reactor enclosure comprises a side wall and an overlying ceiling; and
said coil antenna comprises a top portion overlying said ceiling and a side portion adjacent said side wall.

20. The plasma reactor of claim 19 wherein said top portion has a dome shape and said side portion is cylindrically shaped.

21. The plasma reactor of claim 19 wherein said top portion at least generally conforms with the shape of said ceiling.

22. The plasma reactor of claim 19 wherein said top and side portions of said coil antenna are electrically separate sections thereof.

23. In a plasma reactor including a chamber enclosure capable of containing process gases and a workpiece support for supporting a semiconductor workpiece, a coil antenna adjacent an exterior surface of said chamber enclosure and capable of being connected to an RF power source, said coil antenna comprising:
plural windings of at least one conductor, said windings having an at least nearly flat surface, said flat surface generally facing an interior region enclosed by said chamber enclosure, said flat surface corresponding to a width of said conductor generally parallel to said flat surface that is significantly greater than a height thereof perpendicular to said flat surface, said width exceeding said height along substantially the entire length of said conductor.

24. The plasma reactor of claim 23 wherein said flattened surface has a width w extending generally transversely with respect to the length of said conductor, and wherein said width varies with location along the length of said conductor.

25. The plasma reactor of claim 24 wherein said width w is maximum near an RF grounded end of the coil antenna and minimum near an opposite end of the coil antenna.

26. The plasma reactor of claim 23 wherein said coil antenna of said flattened cross-sectional shape is located at an average distance d from said from said exterior surface exceeding a nominal distance by an amount sufficient to realize about the same capacitance to a plasma within said enclosure as that of a coil antenna at the nominal distance having a circular cross-sectional shape.

27. The plasma reactor of claim 23 wherein said windings have a thickness t, said thickness being enhanced to reduce an electric RF potential of said coil antenna.

28. The plasma reactor of claim 23 wherein said coil antenna of said flattened cross-sectional shape is located at a distance d from said from said exterior surface, said distance d varying as a function of location along the length of said conductor.

29. The plasma reactor of claim 28 wherein said distance d is minimum near an RF grounded end of the coil antenna and maximum near an opposite end of the coil antenna.

30. The plasma reactor of claim 29 wherein:
said coil antenna of said flattened cross-sectional shape is located at a distance d from said from said exterior surface; and
said distance d is minimum near an RF grounded end of the coil antenna and maximum near an opposite end of the coil antenna.

31. The plasma reactor of claim 28 wherein said coil antenna of said flattened cross-sectional shape is located at a distance d from said from said exterior surface, said distance d varying as a function of location along the length of said conductor.

32. The plasma reactor of claim 23 wherein said coil antenna constitutes a single conductor.

33. The plasma reactor of claim 23 wherein said coil antenna comprises multiple conductors.

34. The plasma reactor of claim 33 wherein said multiple conductors of said coil antenna comprise multiple concentric spiral windings.

35. A coil antenna for use in a plasma reactor including a chamber enclosure capable of containing process gases and a workpiece support for supporting a semiconductor workpiece, said coil antenna capable of being located adjacent an exterior surface of said chamber enclosure and of being connected to an RF power source, said coil antenna comprising:
plural windings of a conductor, said windings having a flattened cross-sectional shape defining a major flattened surface thereof generally facing an interior of said chamber enclosure, said flattened surface corresponding to a width of said conductor generally parallel to said flattened surface that is significantly greater than a height thereof perpendicular to said flattened surface, said width exceeding said height along substantially the entire length of said conductor.

36. A plasma reactor comprising:
a plasma processing chamber;
a coil antenna adjacent the external roof of the chamber having a plurality of windings of a conductor having a flattened cross-section with a flattened surface thereof oriented to face the plasma; and wherein the width of the flattened cross section increases towards the periphery of the coil.

37. The reactor as in claim 36, additionally including an RF power supply coupled to the coil antenna at each end thereof so that the periphery of the coil is maintained at the lowest voltage.

38. The reactor as in claim 36, wherein the width of the flattened cross section decreases towards the center of the coil.

39. The reactor as in claim 36, wherein the spacings between windings are approximately uniform.

40. The reactor as in claim 36, wherein the width of the spacing between windings is smaller than the average width of the flattened cross sections of the winding.

41. The reactor as in claim 36, wherein the height of the flattened cross section increases towards the center of the coil.

42. The reactor as in claim 41, wherein the spacing between the coil antenna and the chamber roof increases towards the center of the coil.

* * * * *